United States Patent
Anzai

(10) Patent No.: US 6,847,343 B2
(45) Date of Patent: Jan. 25, 2005

(54) ACTIVE MATRIX TYPE DISPLAY DEVICE

(75) Inventor: Katsuya Anzai, Gifu (JP)

(73) Assignee: Sanyo Electric Co., Ltd. (JP)

( * ) Notice: Subject to any disclaimer, the term of this patent is extended or adjusted under 35 U.S.C. 154(b) by 299 days.

(21) Appl. No.: 10/256,313

(22) Filed: Sep. 27, 2002

(65) Prior Publication Data

US 2003/0067458 A1 Apr. 10, 2003

(30) Foreign Application Priority Data

Sep. 28, 2001 (JP) ........................................ 2001-303788

(51) Int. Cl.$^7$ .............................................. G09G 3/36
(52) U.S. Cl. ........................................ 345/90; 345/211
(58) Field of Search ............................ 257/59, 69, 72; 313/498, 506, 509; 315/169.1, 169.3; 345/76–84, 90, 92, 98, 204, 211; 438/149, 157

(56) References Cited

U.S. PATENT DOCUMENTS

| | | | | |
|---|---|---|---|---|
| 6,028,580 A | * | 2/2000 | Kosegawa et al. | 345/98 |
| 6,040,813 A | * | 3/2000 | Takubo | 345/92 |
| 6,456,013 B1 | * | 9/2002 | Komiya et al. | 315/169.1 |
| 6,545,424 B2 | * | 4/2003 | Ozawa | 315/169.3 |
| 6,690,110 B1 | * | 2/2004 | Yamada et al. | 313/506 |
| 6,690,117 B2 | * | 2/2004 | Komiya | 315/169.3 |
| 6,750,833 B2 | * | 6/2004 | Kasai | 345/76 |
| 6,784,454 B2 | * | 8/2004 | Anzai | 257/59 |
| 2003/0076046 A1 | * | 4/2003 | Komiya et al. | 315/169.3 |

* cited by examiner

Primary Examiner—Amare Mengistu
Assistant Examiner—Nitin Patel
(74) Attorney, Agent, or Firm—Cantor Colburn LLP

(57) ABSTRACT

An active matrix type display device comprising a plurality of pixels arranged in a matrix form, wherein each of the plurality of pixels comprises a display element, a second TFT for supplying power from a driving power supply line to the display element, and a first TFT for controlling the second TFT based on a data signal supplied from a data line when selected, and the driving power supply line extends across the pixel region. More specifically, of opposing first and second sides of a pixel, in a section where the first TFT is connected to the data line, the driving power supply line is placed on the second side, being the side opposite the data line, and in a section where the second TFT is connected to the driving power supply line, the driving power supply line is placed on the first side. In this manner, pixels provided in positions shifted for each row can be connected with a simple wiring layout.

14 Claims, 5 Drawing Sheets

ACTIVE MATRIX TYPE DISPLAY DEVICE

BACKGROUND OF THE INVENTION

1. Field of the Invention

The present invention relates to an active matrix type display device, and in particular to a layout of pixels and wiring in such a device.

2. Description of the Related Art

Electroluminescence (hereinafter referred to simply as "EL") display devices in which a self-illuminating EL element is used for each pixel have advantages such as thinness and low power consumption, in addition to being self-illuminating. Because of these advantages, EL display devices have currently attracted much attention as an alternative display device for liquid crystal display devices (LCDs) and CRTs, and effort is therefore now being expended on their development.

In particular, an active matrix type EL display device in which a switching element for individually controlling an EL element such as a thin film transistor (TFT) is provided in each pixel so that the EL element is driven individually for each pixel is highly expected as a high-resolution display device.

FIG. 1 shows a circuit structure for a pixel in an active matrix type EL display device having m rows and n columns. In this EL display device, a plurality of gate lines GL extend on a substrate in the row direction and a plurality of data lines DL and power supply lines VL extend on the substrate in the column direction. Each pixel is formed in a region surrounded by gate lines GL and data lines DL, and comprises an organic EL element 50, a switching TFT (first TFT) 10, an EL element driving TFT (second TFT) 20, and a storage capacitor Cs.

The first TFT 10 is connected to a gate line GL and a data line DL and is switched ON based on a gate signal (selection signal) received through a gate electrode. A data signal supplied via the data line DL at this point is stored in the storage capacitor Cs which is connected between the first TFT 10 and the second TFT 20. A voltage corresponding to the data signal supplied through the first TFT 10 is supplied to the gate electrode of the second TFT 20, and the second TFT 20 supplies an electric current corresponding to the voltage value from the power supply line VL to the organic EL element 50. As a result of these operations, light is emitted from the organic EL element 50 of each pixel with a luminance corresponding to the data signal so that a desired image is displayed.

In liquid crystal display devices (LCD) which are currently widely used as flat panel displays, color display is already common. In such color LCDs, each of a plurality of pixels which are placed on a substrate is assigned one of several colors such as, for example, R (red), G (green), and B (blue). Similar color display devices are also desired for display devices using an organic EL element. In order to realize such a color display, the basic arrangement of the R, G, and B pixels is common to the arrangement used in color LCDs.

For example, in a color LCD or the like, typically, a data signal (display signal) is supplied to each color through different data lines for pixels corresponding to each color on the substrate, in order to simplify the display signal processing and the driving circuit and to reduce the influence from display contents for differing colors. A stripe arrangement is known as an arrangement of pixels for a color display device in which pixels of the same color are aligned in the column direction. In active matrix type color LCDs in which such stripe arrangement is employed, the data line for supplying a data signal (display signal) to a thin film transistor which controls a liquid crystal capacitor for each pixel extends in an approximate straight line in the column direction, similar to the case for monochromic displays. Data signals can be supplied through one data line to a plurality of pixels of the same color aligned in a same column.

Similarly, when an active matrix type color organic EL display device is realized with the circuit structure of FIG. 1 and the stripe arrangement, the pixels each having an organic EL element 50 of the same color are aligned in an approximate straight line in the column direction. Therefore, the data lines DL for supplying data signals to each pixel and the driving power supply lines VL for supplying current are both arranged in an approximate straight line in the column direction along the arrangement of the pixels.

On the other hand, an arrangement commonly referred to as a delta arrangement is known as an arrangement of pixels in color display devices for displaying images with higher resolutions, in which the pixels of the same color are arranged in the column direction not in a straight line but with a shift of a predetermined pitch for each row. For active matrix type LCDs, display devices with such delta arrangement are widely known. The pixels of the same color are placed with a shift of, for example, a distance corresponding to 1.5 pixels in the row direction. Therefore, the data line for supplying a data signal to the pixels of the same color extends in the column direction in an undulating manner between pixels that are shifted for each row.

Similarly, in organic EL display devices, it is expected that such delta arrangement will be employed in response to a demand for improving the resolution or the like. However, in an active matrix type organic EL display device, as shown in FIG. 1, a data line DL and a driving power supply line VL must be connected to each pixel in the column direction and, thus, when the delta arrangement is employed the wiring becomes more complicated than in a comparable LCD. In addition, in many cases these two wirings are formed through simultaneous patterning using the same material to combine the manufacturing processes. In this case, it is necessary that these two wirings be placed in the column direction without intersecting each other. Because of the above described reasons, it is desired that at least the data line DL be connected to the pixels of the same color.

FIG. 2 shows a possible example layout of pixels in an active matrix type organic EL display device wherein the delta arrangement is employed. The structure shown in FIG. 2 is designed so that the pixels of the same color which are connected to the same data line DL are symmetric about the data line DL. For example, as shown in FIG. 2, in a pixel for R ("R pixel") on the first row, the first TFT 10 is placed on the right side in the figure of the pixel and is connected to the data line 43r, and in an R pixel on the second row, the first TFT 10 is placed on the left side in the figure and is connected to the same data line 43r. In this manner, by employing a pattern within the pixels which alternates between left and right for each row, the undulation of the data line 43 among the rows is inhibited to a distance corresponding to one pixel for the case shown in FIG. 2 where the pixels of the same color are shifted by a distance corresponding to two pixels for each row. This structure is employed because the shorter undulating distance results in less problems such as delay and attenuation of the signals or the like caused by the wiring resistance.

On the other hand, the driving power supply line (VL) 45 is connected to a common driving power supply Pvdd and is not required to be connected to pixels of the same color. As described above, however, the driving power supply line VL 45 must not intersect the data line 43, in order to pattern the driving power supply line VL 45 simultaneously with the data line 43 using the same material. Therefore, the driving power supply line VL extending in the region between the R pixel and G pixel in the first row and connected to the second TFT 20 of the G pixel in the first row, as shown in FIG. 2, for example, passes a region between a data line 43g for G and a data line 43r for R, extends in a region between the R pixel and G pixel in the second row, and is connected to the second TFT 20 of the R pixel in the second row.

The layout of FIG. 2 satisfies the conditions that the data line DL is connected to the pixels of the same color with a short wiring length and that the driving power supply line VL is connected to each pixel without intersecting the data line DL. However, as is clear from FIG. 2, the wiring undulates in a complex manner among the rows and the area occupied by the wiring in the region between the rows is large. When the area occupied by the wiring is large as in this case, the emission region (formation region of the organic EL element) is significantly limited on a substrate having a limited area, and, thus, improvements in aperture ratio cannot be achieved, that is, bright display cannot be produced.

In addition, because of the convoluted wiring, the total length of the wiring becomes long, and, consequently, the wiring resistance is also increased. For example, the maximum current value that can be supplied by the driving power supply line 45 must be substantially the same for any pixel at any position of the display device, otherwise a variation in emission brightness will occur among the organic EL elements 50 on a display screen. Therefore, when the wiring resistance of the driving power supply line 45 is increased, there is a problem in that the pixels located at positions farther away from the driving power supply will exhibit lower emission brightness because of the voltage drop caused by the wiring resistance of the longer driving power supply line.

SUMMARY OF THE INVENTION

The present invention was conceived to solve the problem described above, and an object of the present invention is to simplify the wiring pattern in an active matrix type display device utilizing an organic EL element or the like.

In order to achieve at least the object described above, according to one aspect of the present invention, there is provided an active matrix type display device comprising a plurality of pixels arranged in a matrix form, wherein each of the pixels comprises an element to be driven, an element driving thin film transistor for supplying power from a driving power supply line to the element to be driven, and a switching thin film transistor for controlling the element driving thin film transistor based on a data signal supplied from a data line when selected, and, in each pixel, of a first side and a second side of a pixel which opposes each other, the driving power supply line is placed on the second side, being the side opposite the data line, in a section where the switching thin film transistor is connected to the data line and is placed on the first side, which is the same side as the data line, in a section where the element driving thin film transistor is connected to the driving power supply line.

According to another aspect of the present invention, it is preferable that, in the active matrix type display device, the driving power supply line extends from the second side of the pixel across the pixel to the first side of the pixel through a region between the switching thin film transistor and the element to be driven within the pixel.

According to another aspect of the present invention, it is preferable that, in the active matrix typed is play device, the driving power supply line extends from the second side of the pixel through a region between the switching thin film transistor and the element to be driven within the pixel to the first side of the pixel in a direction along an extension direction of a selection line for supplying a selection signal to the switching thin film transistor.

With the arrangements of the driving power supply line as described above, it is possible to achieve a very simple wiring pattern between adjacent rows in a matrix without adversely affecting other circuit elements electrically due to the presence of the driving power supply line, such as, for example, generation of a parasitic capacitance. In addition, although the driving power supply line crosses within the pixel region from the second side to the first side, by employing a pattern in which the driving power supply line extends through a region between the switching thin film transistor and the element to be driven in a direction, for example, along the extension direction of the selection line as described above, it is possible to eliminate a diagonally extending portion of a wiring which tends to reduce the wiring efficiency in a matrix arrangement. Therefore, it is possible to improve the wiring efficiency and to increase the emission region of the pixel.

According to another aspect of the present invention, there is provided an active matrix type display device comprising a plurality of pixels arranged in a matrix form, wherein each of the pixels comprises an element to be driven, an element driving thin film transistor for supplying power from a driving power supply line to the element to be driven, and a switching thin film transistor for controlling the element driving thin film transistor based on a data signal supplied from a data line when selected, and in each pixel, a region of connection between the switching thin film transistor and the data line and a region of connection between the element driving thin film transistor and the driving power supply line are provided near a first side of the pixel.

The connection region between the data line and the switching thin film transistor can be provided, for example, on a second side of the pixel in order to prevent obstruction by the driving power supply line. The element driving thin film transistor formed on the first side can be connected to the driving power supply line extending across from the second side to the first side. With such a configuration, for example, even with a delta arrangement it is not necessary to provide a special bypass wiring for the driving power supply line or to provide a wiring in a diagonal direction between the rows. As a result, the wiring pattern of the driving power supply line can be simplified and the wiring length can be shortened.

According to another aspect of the present invention, there is provided an active matrix type display device comprising a plurality of pixels arranged in a matrix form, wherein each of the pixels comprises an element to be driven, an element driving thin film transistor for supplying power from a driving power supply line to the element to be driven, and a switching thin film transistor for controlling the element driving thin film transistor based on a data signal supplied from a data line when selected; a gate of the element driving thin film transistor is connected to a corresponding switching thin film transistor; and the driving power supply line extends, in each pixel, across the pixel and intersects a connection wiring path between the gate of the element driving thin film transistor and the switching thin film transistor.

Even when the driving power supply line is placed to extend across the pixel region, for example, when the connection wiring path is integral with the gate of the element driving thin film transistor, even if the driving power supply line crosses the wiring path, it is possible to form the gate and the driving power supply line using different materials through different steps as different layers so that the gate and the driving power supply line can be formed such that at least these layers are insulated. No special insulative structure is necessary for allowing these layers to intersect. Therefore, it is possible to accommodate the delta arrangement or the like while designing a driving power supply line of minimum wiring length.

According to another aspect of the present invention, it is preferable that, in any of the active matrix type display devices, the plurality of pixels are arranged in the column direction of the matrix such that the pixels of the same color in adjacent rows are shifted from each other in the row direction.

According to another aspect of the present invention, it is preferable that, in any of the active matrix type display devices, the data line extends in the column direction of the matrix through a region between each pixel, and the switching thin film transistors of the pixels of the same color which are provided alternately for each row on the left side of the data line and on the right side of the data line are connected to the data line.

According to another aspect of the present invention, it is preferable that, in any of the active matrix type display devices, the driving power supply line extends in the column direction without intersecting the data line and is connected to the element driving thin film transistor of a corresponding pixel.

Even when it is necessary to form the data line and the driving power supply line in a region between pixel regions arranged in a matrix form or undulated within a pixel region, by employing a layout in which the two lines do not intersect, it is possible to form these lines simultaneously using the same material, to thereby allow combination of the manufacturing processes which is advantageous in terms of reducing manufacturing cost, etc.

According to the present invention, even when the pixels of the same color are arranged to be shifted by a predetermined pitch such as in a delta arrangement, wiring for a data line for supplying a data signal to each pixel and for a driving power supply line for supplying power to each pixel can be provided in a simple manner. In particular, also for the wiring pattern of the driving power supply line, it is possible to minimize the wiring length similar to the data line and, thus, it is possible to maximize the emission region of each pixel and to realize bright, high resolution color display devices.

DESCRIPTION OF PREFERRED EMBODIMENT

Figure 1:
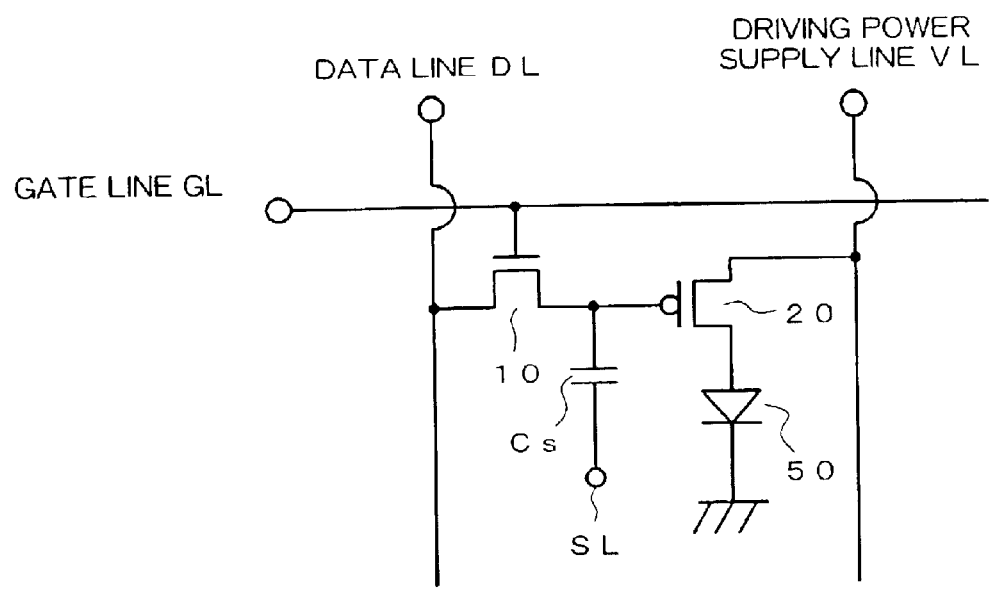
FIG. 1 is a diagram showing a circuit structure of a pixel of an active matrix type organic EL display device.

The preferred embodiment of the present invention (hereinafter referred to simply as the "embodiment") will now be described referring to the drawings.

Figure 3:
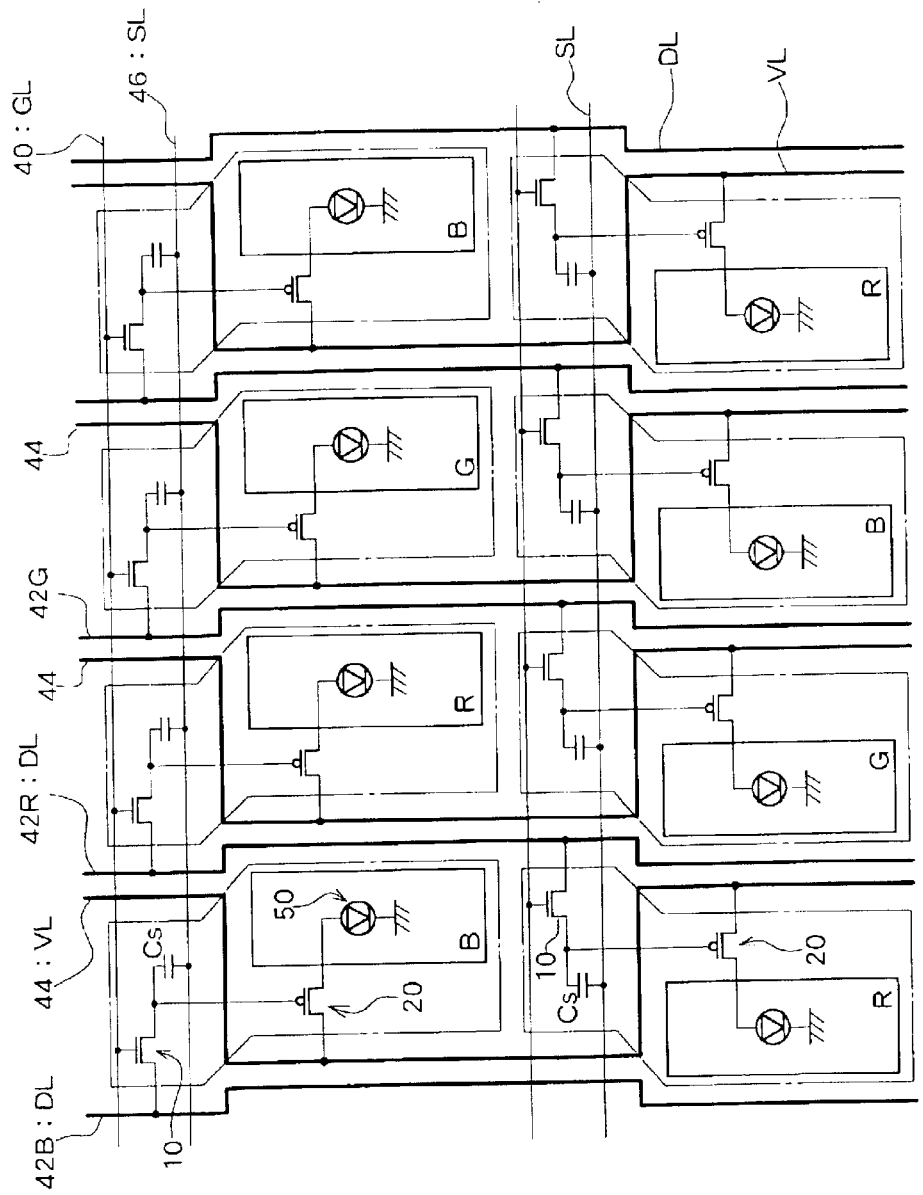
FIG. 3 is a schematic diagram showing an arrangement of pixels in a preferred embodiment of the present invention.

FIG. 3 shows a pixel layout of an active matrix type EL display device having m rows and n columns according to an embodiment of the present invention. A pixel is represented in FIG. 3 by a region surrounded by one-dotted chain lines. The circuit structure is identical to that shown in FIG. 1 and each pixel comprises an organic EL element 50 as an element to be driven, a switching TFT (first TFT) 10, an element driving TFT (second TFT) 20, and a storage capacitor Cs.

The gate of the first TFT 10 is connected to a gate line (GL) 40. In an n-channel (n-ch) first TFT 10, for example, a drain of the first TFT 10 is connected to a data line (DL) 42 and a source is connected to the storage capacitor Cs. The storage capacitor Cs comprises a first electrode which is integral with the source of the first TFT 10 and a second electrode provided to oppose the first electrode. The second electrode is formed integral with a capacitance line (SL) 46 extending in the row direction. The source of the first TFT 10 and the first electrode of the storage capacitor Cs are connected to a gate of the second TFT 20. In a p-channel (p-ch) second TFT 20, for example, a source of the second TFT 20 is connected to a driving power supply line (VL) 44 and a drain is connected to an anode of the organic EL element 50. The conductivity of the first and second TFTs 10 and 20 are not limited to n-ch and p-ch as described above. For example, conductivities for the TFTs may be reversed (p-ch for the first TFT 10 and n-ch for the second TFT 20) or the same conductivity may be employed for both TFTs (n-ch for both first and second TFTs 10 and 20 or p-ch for both first and second TFTs 10 and 20). Even with any of these alternative structures, the layouts for the data line 42 and the driving power supply line 44 are identical to the layouts which will be described below.

A pixel has a circuit structure as described above. Each pixel corresponds to one color among R (red), G (green), and B (blue), and a delta arrangement is employed in which the pixels of the same color are aligned in the column direction and shifted by a predetermined pitch (in FIG. 3, a distance corresponding to slightly less than two pixels) for each row. The data line DL 42 is connected to the first TFTs 10 of the pixels of the same color which are shifted for each row and provided alternately on the right side and on the left side with respect to the data line 42. The data line 42 extends in the column direction while undulating between the pixels.

In the present embodiment, a layout is employed in which the driving power supply line 44 extends in the column direction while crossing, in each pixel, the formation region of the pixel and is connected to the second TFT 20. The driving power supply line 44 supplies electric current to the organic EL element 50 through the second TFT 20.

An R pixel in the first row of FIG. 3 will now be described as a specific example. The driving power supply line 44 is placed on a second side (on the right side in FIG. 3) which opposes a side on which the data line for R pixel is placed (a first side; shown on the left side in FIG. 3) in a section where the first TFT 10 of the R pixel is connected to the data line 42R for R.

Also in the present embodiment, the first and second TFTs 10 and 20 of each pixel are placed near the same side (in this example, the first side on which the data line is placed) of the opposing sides (first side and second side) along the column direction of the pixel. Therefore, the driving power supply line 44 extends across within the R pixel from the second side to the first side to which the data line 42 is placed in order to connect to the second TFT 20. In a section where the driving power supply line 44 is connected to the second TFT 20, the driving power supply line 44 is placed on the first side of the pixel and extends in the column direction while being aligned with the data line 42R for R.

Similarly, in the G pixel of the first row adjoining the R pixel, in a section where a data line 42G for G is connected to the first TFT 10 of the G pixel, a driving power supply line 44 is placed on a second side (right side in FIG. 3) of the pixel opposite the data line 42G for G so that the driving power supply line 44 does not obstruct the connection. In a section where the driving power supply line 44 is connected to the second TFT 20 of the G pixel, the driving power supply line 44 is placed on a first side (left side in FIG. 3) of the pixel which is the same side as the data line 42G for G.

The second row will now be described referring to a G pixel under the R pixel of the first row as an example. In the second row of FIG. 3, in a section of the G pixel of the second row where the first TFT 10 of the G pixel and the data line 42G for G are connected, the driving power supply line 44 extending in an approximate straight line in the column direction on the first side of the R pixel of the first row (right side in FIG. 3) is placed on a second side of the G pixel of the second row, that is, the side (on the left side of FIG. 3) opposite the first side of the G pixel of the second row on which the data line 42G for G is placed.

The driving power supply line 44 extends across the G pixel region of the second row from the second side to the first side, and in a section of the G pixel where the second TFT 20 of the G pixel and the driving power supply line 44 are connected, the driving power supply line 44 is placed on the right side of FIG. 3 which is the first side of the G pixel and extends in the column direction while being aligned with the data line 42G (for G) placed also on the first side of the G pixel.

It is desirable that the position of the region across which the driving power supply line 44 extends in each pixel be a position which does not affect the formation region of the organic EL element 50 which substantially defines the emission region in each pixel. In active matrix type organic EL display devices, the emission region in each pixel is substantially defined by the formation region of the organic EL element 50, in particular, by the extension region of the anode which is formed individually for each pixel. The first and second TFTs 10 and 20 for driving the organic EL element 50, the storage capacitor Cs, etc. are placed in the remaining region of each pixel and, thus, this remaining region does not contribute to light emission. Therefore, by placing the driving power supply line 44 such that the driving power supply line 44 passes through the region which does not contribute to light emission as much as possible, it is possible to prevent reduction in the emission area. In consideration of this, in the present embodiment a layout is employed in which the driving power supply line 44 extends from the second side of the pixel, across the pixel through a region between the first TFT 10 and the organic EL element 50 in the pixel along the extension direction of the gate line 40 to the first side of the pixel, and in the column direction on the first side while being aligned with the data line 42.

Because the second TFT 20 supplies current from the driving power supply line 44 to the organic EL element 50, in many configurations the second TFT 20 is provided near the formation region of the organic EL element 50. On the other hand, in many other configurations the first TFT 10 which captures a data signal upon reception of a selection signal from the gate line 40 is provided near the gate line 40. Therefore, in order to place the driving power supply line 44 avoiding the formation region of the organic EL element 50 as much as possible and not intersecting the data line 42, it is desirable to place the driving power supply line 44 to pass through a region between the emission region (formation region of the organic EL element 50) and the formation region of the first TFT 10.

In this structure, the gate electrode of the second TFT 20 is electrically connected to a source (or drain) of the first TFT 10. Thus, the driving power supply line 44 which extends across the region between the organic EL element 50 and the first TFT 10 as described above intersects a wiring path between the gate of the second TFT 20 and the source of the first TFT 10. On the other hand, as shown in FIG. 3, the driving power supply line 44 is arranged so that it does not intersect the data line 42. The driving power supply line 44 and the data line 42 are formed using the same material such as, for example, Al, through simultaneously patterning. On the other hand, the gate line 40, the storage capacitor line 46, and the gate electrode of the second TFT are formed using a material such as, for example, Cr, through simultaneous patterning of a layer below the layer of the driving power supply line 44 and the data line 42 with an interlayer insulative layer interposed therebetween. Therefore, even when the driving power supply line 44 extends across the pixel and intersects the gate of the second TFT 20 as described above, the driving power supply line 44 can be insulated from the gate of the second TFT 20 by the interlayer insulative layer, thus allowing for relatively free wiring pattern of the driving power supply line 44 above the gate electrode of the second TFT 20 or the wiring layer formed integral with the gate of the second TFT 20. However, in this structure, it is desirable to minimize overlapping regions between the wirings because a coupling capacitance or the like may be formed.

Figure 4:
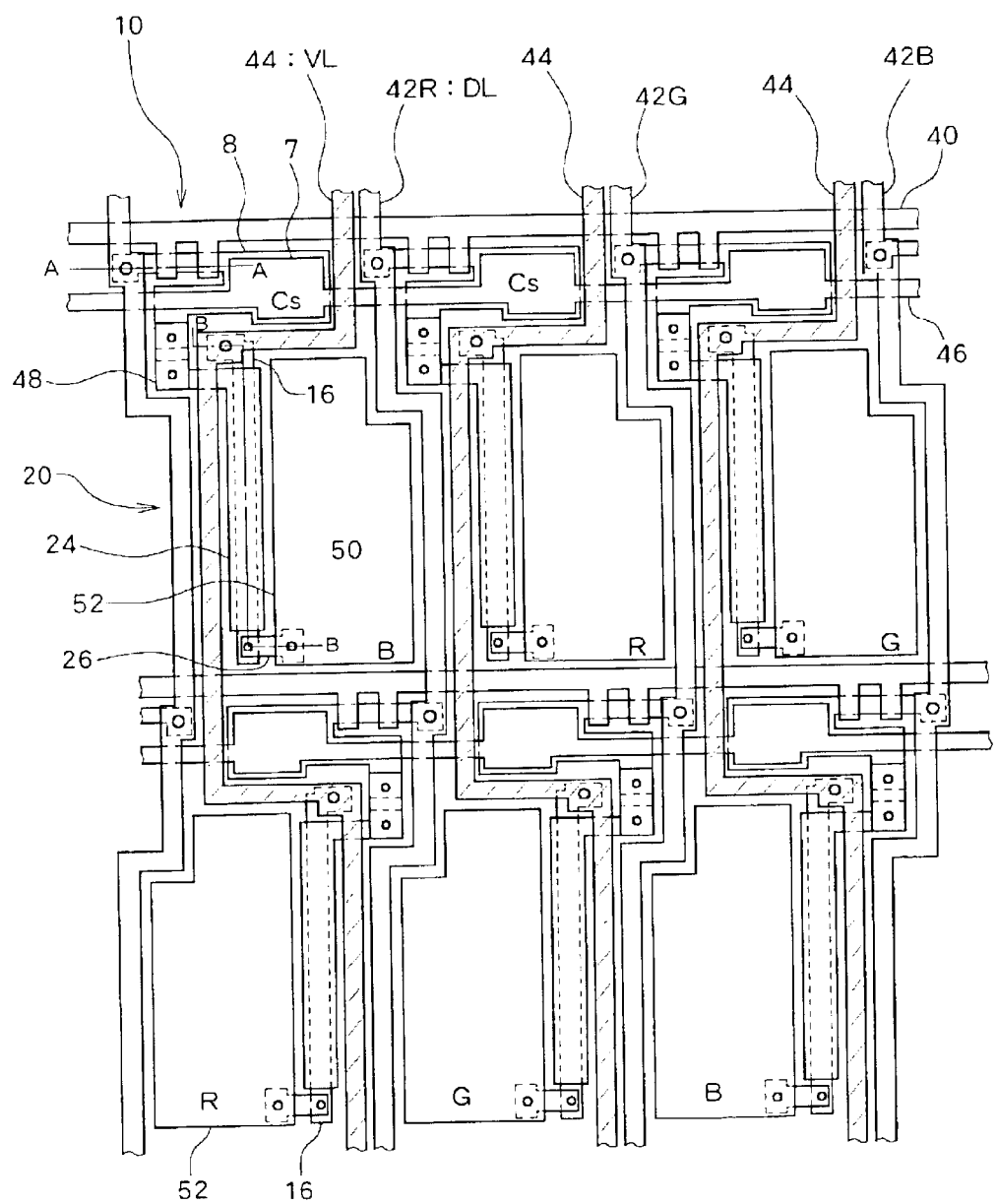
FIG. 4 is a planer diagram showing in more detail the arrangement shown in FIG. 3.
Figure 5A:
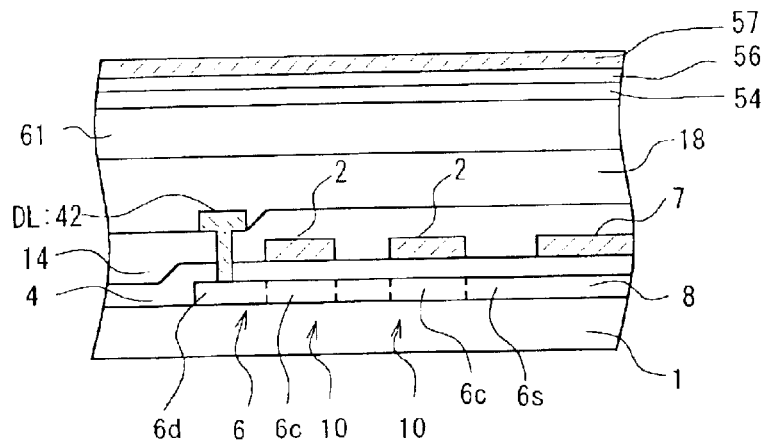
FIGS. 5A and 5B are cross sectional diagrams respectively showing cross sections along the A—A line and B—B line in FIG. 4.
Figure 5B:
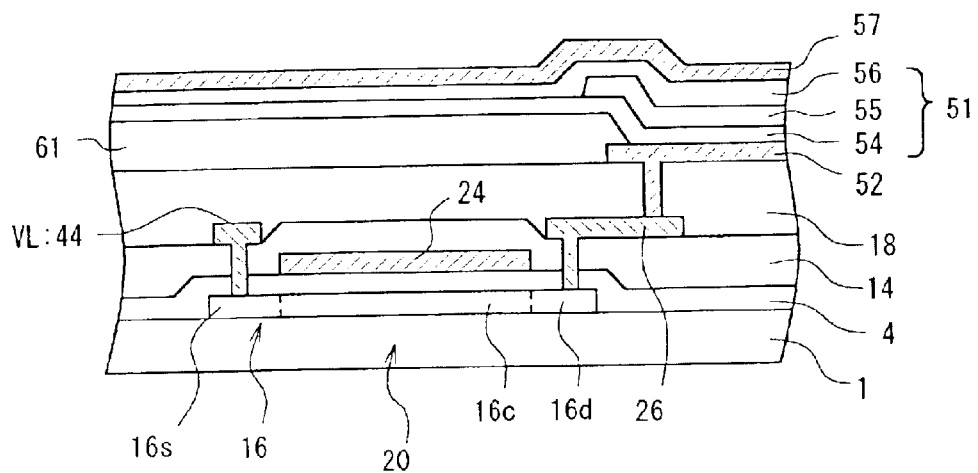

FIG. 4 shows an example planer structure of a pixel corresponding to the circuit layout as described above. FIGS. 5A and 5B respectively show cross sections along the A—A line of FIG. 4 (cross section of the first TFT) and along the B—B line of FIG. 4 (cross section of the second TFT). In the example structure shown in FIG. 4, a delta arrangement is employed in which the pixels of the same color are shifted for each row by a distance corresponding to approximately 1.5 pixels. As shown in FIG. 4, an organic EL element 50, a first TFT 10, a second TFT 20, and a storage capacitor Cs for one pixel are formed in a region defined by gate lines 40 and data lines 42.

The first TFT 10 is formed in a region near the intersection between the gate line GL and the data line DL. In the example structure of FIG. 4, the first TFT 10 of each pixel in the first row is placed on the left side of the pixel (a first side of the pixel) while the first TFT 10 of each pixel in the second row is placed on the right side of the pixel (a first side of the pixel).

As shown in FIG. 5A, an active layer 6 of the first TFT 10 is formed on a transparent insulative substrate 1 such as glass. The active layer 6 is made of p-Si produced by polycrystallizing a-Si through a laser annealing treatment. A gate electrode 2 integral with a gate line 40 is formed to protrude from the gate line 40. Two gate electrodes 2 are formed on a gate insulative film 4 formed to cover the active layer 6, to form a TFT having a double gate structure circuit-wise. In this structure, in the active layer 6, a region beneath the gate electrode 2 is a channel region 6c, and a drain region 6d and a source region 6s to which an impurity such as phosphorus (P) is doped are provided in regions on both sides of the channel region 6c, to form an n-ch TFT.

The drain region 6d of the first TFT 10 is connected to the data line 42 which is formed on an interlayer insulative film 14 formed to cover the entirety of the first TFT 10 and which supplies a data signal of a corresponding color to a pixel, through a contact hole provided in the interlayer insulative film 14 and in the gate insulative film 4.

The storage capacitor Cs is connected to the source region 6s of the first TFT 10. The storage capacitor Cs is formed in a region where a first electrode 7 and a second electrode 8 overlap with the gate insulative film 4 interposed therebetween. The first electrode 7 extends in the row direction similar to the gate line 40 as shown in FIG. 4 and is formed integral with the capacitance line 46 formed using the same material as the gate. The second electrode 8 is integral with the active layer 6 of the first TFT 10 and is formed by the active layer 6 extending to the formation position of the first electrode 7. As shown in FIG. 4, the second electrode 8 is connected to a gate electrode 24 of the second TFT 20 through a connector 48 on the first side of the pixel which is the side on which the first and second TFTs 10 and 20 are placed.

In the present embodiment, the second TFT 20 is formed, similar to the first TFT 10, within a pixel on the side on which the data line 42 for supplying a data signal to the pixel is placed. In other words, of two opposing sides of a pixel having a quadrangular shape or a similar shape which extend in the column direction, both the first TFT 10 and the second TFT 20 are placed on the first side on which the data line 42 is placed. The second TFT 20 has a cross sectional structure as shown in FIG. 5B, and, in the present embodiment, comprises an elongated channel 16c along the extension direction (column direction) of the data line 42. The active layer 16 of the second TFT 20 is formed on the substrate 1 simultaneously with the active layer 6 of the first TFT 10, and thus, polycrystalline silicon formed by polycrystallizing a-Si through a laser annealing treatment is utilized.

The channel length direction of the second TFT 20 is set to be along the longitudinal direction of the pixel having an elongated shape. It is not necessary, however, to set the channel length direction in this manner or to significantly elongate the channel length as shown in the drawings. However, by employing a structure in which a sufficiently long channel length is secured in the direction along the extension direction of the data line, in the case where a pulse-shaped laser is scanned in the channel length direction, for example, polycrystallization of the entire region of the active layer of the second TFT 20 cannot be achieved by one pulse and, thus, this structure necessitates polycrystallization through a plurality of laser irradiation pulses. With such a structure, it is possible to prevent significant differences to be created in the transistor characteristics among the second TFTs 20 of pixels in different positions.

A gate insulative film 4 is formed on the active layer 16 made of a polycrystalline silicon and, similar to the first TFT 10, a gate electrode 24 of the second TFT 20 is formed on the gate insulative film 4. The gate electrode 24 of the second TFT 20 is connected through a connector 48 to the second electrode 8 of the storage capacitor Cs which is integral with the active layer 6 of the first TFT 10 and is patterned to extend from the connector 48 placed on the end of the first side of the pixel to widely cover, on the gate insulative film 4, a region above the active layer 16.

In the active layer 16 of the second TFT 20, a channel region 16c is formed in the region covered by the gate electrode 24, and a source region 16s and a drain region 16d are respectively formed on both sides of the channel region 16c. The source region 16s of the active layer 16 is connected to the driving power supply line 44 through a contact hole formed to penetrate through the gate insulative film 4 and the interlayer insulative film 14 over the active layer 16 on the first side of the pixel (in FIG. 4, the first side of the pixel and between the connector 48 and the organic EL element 50). As described above, the driving power supply line 44 is placed on the second side of the pixel in the section of the pixel where the first TFT 10 is connected to the data line 42, but in the positions below the section of the pixel where the second TFT 20 is connected to the driving power supply line 44 (downward direction in FIG. 4), the driving power supply line 44 extends in the column direction on the first side of the pixel while being aligned with the data line 42. In the pixel of the second row in FIG. 4, the driving power supply line 44 extends in the row direction across the pixel from the second side through a region between the storage capacitor Cs and the organic EL element 50 to the first side, is connected to the active layer 16 of the second TFT 20, and extends in the column direction substantially parallel to the data line 42 for supplying a data signal to the pixel of the second row.

The shapes and structures of the first TFT 10 and second TFT 20 are not limited to those shown in FIGS. 4, 5A, and 5B, but it is necessary that at least the contact position between the first TFT 10 and the data line 42 and the contact position between the second TFT 20 and the driving power supply line 44 are placed on the same side (for example, first side) of the pixel in order to simplify the wiring pattern of the driving power supply line 44.

As shown in FIG. 4, the connector 48 is placed between the data line 42 and the connection position between the active layer 16 and the driving power supply line 44 in a manner to avoid the driving power supply line 44. The connector 48 can be formed through patterning which is simultaneous with that of the data line 42 and the driving power supply line 44 using the same material such as, for example, Al. In addition, in the example structure of FIG. 4, the connector 48 is placed to bypass in the row direction the contact between the driving power supply line 44 and the active layer 16. With this configuration, each pixel has an overall shape of approximate rectangle or a shape similar to a rectangle, although the center in the row direction of the formation region of the first TFT 10 and the storage capacitor Cs is slightly shifted with respect to that of the formation region of the second TFT 20 and the organic EL element 50. The overall shape is not limited to an approximate rectangular or a shape similar to a rectangle, but it is desirable to employ a structure in which the first TFT 10 and the second TFT 20 are placed on the side of the pixel through which the data line passes and the driving power supply line VL partially passes through the same side.

The gate electrode 24 of the second TFT 20 extending from the connector 48 toward the extension region of the active layer 16 intersects the driving power supply line 44 near the connector 48 with the interlayer insulative film 14 interposed therebetween.

In this example structure, the drain region 16d of the second TFT 20 is connected to a connector 26 near the gate line 40 corresponding to the next row in the matrix through a contact hole formed to penetrate through the gate insulative film 4 and the interlayer insulative film 14, wherein the connector 26 is formed simultaneously with the driving power supply line 44 or the like using the same material. The connector 26 extends from the contact position with the active layer 16 toward a formation region of an anode of the organic EL element 50 to be described below. The connector 26 is electrically connected to an anode 52 of the organic EL element 50 through a contact hole provided in a first planarization insulative layer 18 formed over the entire surface of the substrate covering the driving power supply line 44, data line 42, and connectors 48 and 26.

As shown in FIG. 5B, a second planarization insulative layer 61 is formed on the first planarization insulative layer 18, the second planarization insulative layer 61 having an opening only in the central region of formation of the anode 52 of the organic EL element 50 and covering the edge of the anode 52, the wiring region, and the formation region of the first and second TFTs. A light emitting element layer 51 of the organic EL element 50 is formed on the anode 52 and the second planarization insulative layer 61. A metal electrode 57 which is common to all pixels is formed above the light emitting element layer 51.

The organic EL element 50 comprises a transparent anode 52 made of a material such as ITO (Indium Tin Oxide), a cathode 57 made of a metal such as, for example, Al, and a light emitting element layer (organic layer) 51 between the anode 52 and the cathode 57 in which organic compounds are used. In the present embodiment, as shown in FIG. 5B, the anode 52, light emitting element layer 51, and cathode 57 are layered in that order from the side of the substrate 1.

The light emitting element layer 51 in this example structure comprises, for example, a hole transport layer 54, an organic emissive layer 55, and an electron transport layer 56 layered from the anode through, for example, vacuum evaporation. At least the emissive layer 55 is made of a material different for each emission color, but the hole transport layer 54 and the electron transport layer 56 may be formed to be common for all pixels as shown in FIGS. 5A and 5B. Examples of materials that may be used for each layer are listed below.

Figure 2:
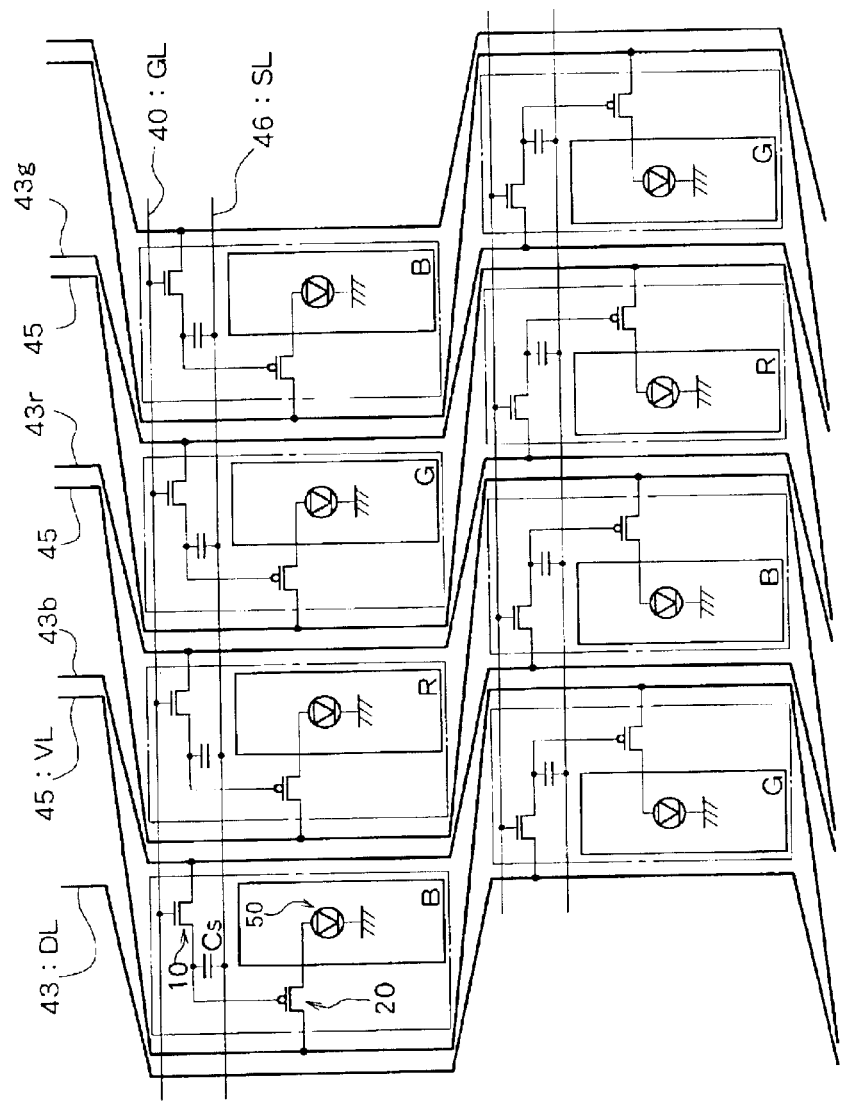
FIG. 2 is a diagram showing a predicted example layout of an active matrix type organic EL display device employing a delta arrangement.

Hole transport layer 54: NBP
Emissive layer 55:
  Red (R)—host material ($Alq_3$) doped with a red dopant (DCJTB)
  Green (G)—host material ($Alq_3$) doped with a green dopant
  (coumarin 6)
  Blue (B)—host material ($Alq_3$) doped with a blue dopant (perylene)
Electron Transport Layer 56: $Alq_3$ It is also possible to form an electron injection layer between the cathode 57 and the electron transport layer 56 using, for example, lithium fluoride (LiF) or the like. The hole transport layer may further comprise a first hole transport layer and a second hole transport layer which are made of different materials. Each light emitting element layer 51 comprises at least an emissive layer 55 which contains an emissive material, but the hole transport layer and the electron transport layer may not be necessary depending on the materials to be used. The unabbreviated names for the above abbreviated materials are as follows. The present invention is not limited to the exemplified configuration. "NBP" N,N'-di((naphthalene-1-yl)-N,N'-diphenyl-benzidine) "$Alq_3$" tris (8-hydroxyquinolinato) aluminum "DCJTB" (2-(1,1-dimethylethyl)-6-(2-(2,3,6,7-tetrahydro-1,1,7,7-tetram ethyl-1H,5H-benzo[ij]quinolizin-9-yl) ethenyl)-4H-pyran-4-ylide ne)propanedinitrile "coumarin 6" 3-(2-benzothiazolyl)-7-(diethylamino)coumarin As shown in FIG. 4, even when a delta arrangement is employed, there is no region where the wiring extends in a diagonal direction. The present invention thus allows an approximate rectangular shape for each pixel, in particular, for the formation region of the organic EL element 50. For example, in a layout shown in FIG. 2 as described above, as the amount of shift of the pixels in the delta arrangement is increased, the bend in the shape of the pixel becomes more significant to a shape of ">" or "<", thus causing the pattern of the formation region of the organic EL element to be similarly bent. As described above, currently the light emitting element layer 51 is formed through vacuum evaporation. Therefore, in order to form evaporation (deposition) layer of individual pattern for each pixel, it is necessary to perform the evaporation while placing, between a substrate and an evaporation source, an evaporation mask having one or a plurality of openings corresponding to the pattern. When an organic layer is patterned through the openings formed on the evaporation mask as described, it may be more difficult to uniformly evaporate through a complicated opening pattern having a large bend than through a simple rectangular opening pattern. Therefore, by planning the layout of each element in a pixel and wiring pattern of the driving power supply line 44 as in the present embodiment, it is also possible to more uniformly form the organic layer (evaporation layer) of the organic EL element 50.

What is claimed is:

1. An active matrix type display device comprising a plurality of pixels arranged in a matrix form, wherein
    each of said pixels comprises an element to be driven, an element driving thin film transistor for supplying power from a driving power supply line to said element to be driven, and a switching thin film transistor for controlling said element driving thin film transistor based on a data signal supplied from a data line when selected, and
    in each pixel, of a first side and a second side of the pixel which oppose each other, said driving power supply line is placed on said second side, being the side opposite said data line, in a section where said switching thin film transistor is connected to said data line, and said driving power supply line is placed on said first side which is the same side as said data line in a section where said element driving thin film transistor is connected to said driving power supply line.

2. An active matrix type display device according to claim 1, wherein
    said driving power supply line extends from said second side of the pixel across the pixel to said first side of the pixel through a region between said switching thin film transistor and said element to be driven within the pixel.

3. An active matrix type display device according to claim 1, wherein
    said driving power supply line extends from said second side of the pixel through a region between said switching thin film transistor and said element to be driven within the pixel to said first side of the pixel in a direction along the extension direction of a selection line for supplying a selection signal to said switching thin film transistor.

4. An active matrix type display device according to claim 1, wherein
    said plurality of pixels are arranged in the column direction of said matrix such that the pixels of the same color in adjacent rows are shifted from each other in the row direction.

5. An active matrix type display device according to claim 4, wherein
said data line extends in the column direction of said matrix through a region between each pixel, and
said switching thin film transistors of the pixels of the same color which are provided alternately for each row on the left side of said data line and on the right side of said data line are connected to said data line.

6. An active matrix type display device according to claim 4, wherein
said driving power supply line extends in the column direction without intersecting said data line and is connected to said element driving thin film transistor of a corresponding pixel.

7. An active matrix type display device comprising a plurality of pixels arranged in a matrix form, wherein
each of said pixels comprises an element to be driven, an element driving thin film transistor for supplying power from a driving power supply line to said element to be driven, and a switching thin film transistor for controlling said element driving thin film transistor based on a data signal supplied from a data line when selected, and
in each pixel, a region of connection between said switching thin film transistor and said data line and a region of connection between said element driving thin film transistor and said driving power supply line are both placed near a first side of the pixel.

8. An active matrix type display device according to claim 7, wherein
said plurality of pixels are arranged in the column direction of said matrix such that the pixels of the same color in adjacent rows are shifted from each other in the row direction.

9. An active matrix type display device according to claim 8, wherein
said data line extends in the column direction of said matrix through a region between each pixel, and
said switching thin film transistors of the pixels of the same color which are provided alternately for each row on the left side of said data line and on the right side of said data line are connected to said data line.

10. An active matrix type display device according to claim 8, wherein
said driving power supply line extends in the column direction without intersecting said data line and is connected to said element driving thin film transistor of a corresponding pixel.

11. An active matrix type display device comprising a plurality of pixels arranged in a matrix form, wherein
each of said pixels comprises an element to be driven, an element driving thin film transistor for supplying power from a driving power supply line to said element to be driven, and a switching thin film transistor for controlling said element driving thin film transistor based on a data signal supplied from a data line when selected;
a gate of said element driving thin film transistor is connected to a corresponding switching thin film transistor; and
said driving power supply line extends, in each pixel, across the pixel and intersects a connection wiring path between the gate of said element driving thin film transistor and said switching thin film transistor.

12. An active matrix type display device according to claim 11, wherein
said plurality of pixels are arranged in the column direction of said matrix such that the pixels of the same color in adjacent rows are shifted from each other in the row direction.

13. An active matrix type display device according to claim 12, wherein
said data line extends in the column direction of said matrix through a region between each pixel, and
said switching thin film transistors of the pixels of the same color which are provided alternately for each row on the left side of said data line and on the right side of said data line are connected to said data line.

14. An active matrix type display device according to claim 12, wherein
said driving power supply line extends in the column direction without intersecting said data line and is connected to said element driving thin film transistor of a corresponding pixel.

* * * * *